United States Patent
Kobayashi et al.

(10) Patent No.: US 8,721,051 B2
(45) Date of Patent: May 13, 2014

(54) LIQUID EJECTING HEAD, LIQUID EJECTING APPARATUS, AND PIEZOELECTRIC ELEMENT

(75) Inventors: Tomokazu Kobayashi, Shiojiri (JP); Kazuya Kitada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 240 days.

(21) Appl. No.: 13/042,880

(22) Filed: Mar. 8, 2011

(65) Prior Publication Data

US 2011/0221826 A1    Sep. 15, 2011

(30) Foreign Application Priority Data

Mar. 10, 2010  (JP) ................................. 2010-052831

(51) Int. Cl.
    *B41J 2/015*    (2006.01)
(52) U.S. Cl.
    USPC .......................................................... 347/68
(58) Field of Classification Search
    None
    See application file for complete search history.

(56) References Cited

U.S. PATENT DOCUMENTS

| | | | | |
|---|---|---|---|---|
| 7,348,715 B2 * | 3/2008 | Torii et al. | .................. | 310/358 |
| 7,544,244 B2 | 6/2009 | Sakashita et al. | | |
| 7,786,656 B2 | 8/2010 | Sakashita et al. | | |
| 7,845,767 B2 | 12/2010 | Sakashita et al. | | |
| 8,030,828 B2 | 10/2011 | Kobayashi et al. | | |
| 2004/0004650 A1 * | 1/2004 | Torii et al. | .................. | 347/72 |
| 2006/0045840 A1 | 3/2006 | Chen et al. | | |

FOREIGN PATENT DOCUMENTS

| | | |
|---|---|---|
| CN | 1524792 | 9/2004 |
| CN | 101273478 | 9/2008 |
| CN | 101295762 | 10/2008 |
| CN | 101304068 | 11/2008 |
| JP | 2009-256186 | 11/2009 |
| WO | 2009/116683 A1 | 9/2009 |

OTHER PUBLICATIONS

Kobune, Fabrication of High-Density (Bi, La)(Zn, Mg, Ti)O3-PbTiO3 Solid Solutions with Ferroelectric and Piezoelectric Functionalities by Microstructural Control, Jpn. J Appl. Phys. vol. 47, No. 9, pp. 7664-7668 (2008).*
Matthew R Suchomel, et al "Enhanced tetragonality in (x)PbTiOx-(1-x)Bi(Zn1/2Ti1/2)o3) and related solid solution systems" Applied Physics Letters 86, 262905 (2005).
Ilya Grinberg, et al "Structure and Polarization in the High Tc Ferroelectric Bi(Zn, Ti)O3-PbTiO3 Solid Solutions" Physical Review Letters 98, 107601 (2007).
Masafumi Kobune, et al "Fabrication of High-Density (Bi,La)(Zn,Mg,Ti)O3-PbTiO3 Solid Solutions with Ferroelectric and Piezoelectric Functionalities by Microstructural Control" Japanese Journal of Applied Physics, vol. 47, No. 9, 2008, pp. 7664-7668.

* cited by examiner

*Primary Examiner* — Matthew Luu
*Assistant Examiner* — Erica Lin
(74) *Attorney, Agent, or Firm* — Workman Nydegger

(57) ABSTRACT

Provided is a piezoelectric element comprising a piezoelectric layer and an electrode. The piezoelectric layer includes a solid solution of bismuth lanthanum titanate zincate and lead titanate. The molar ratio of the bismuth lanthanum titanate zincate to the lead titanate in the piezoelectric layer is 0.39 or more and 0.61 or less.

7 Claims, 8 Drawing Sheets

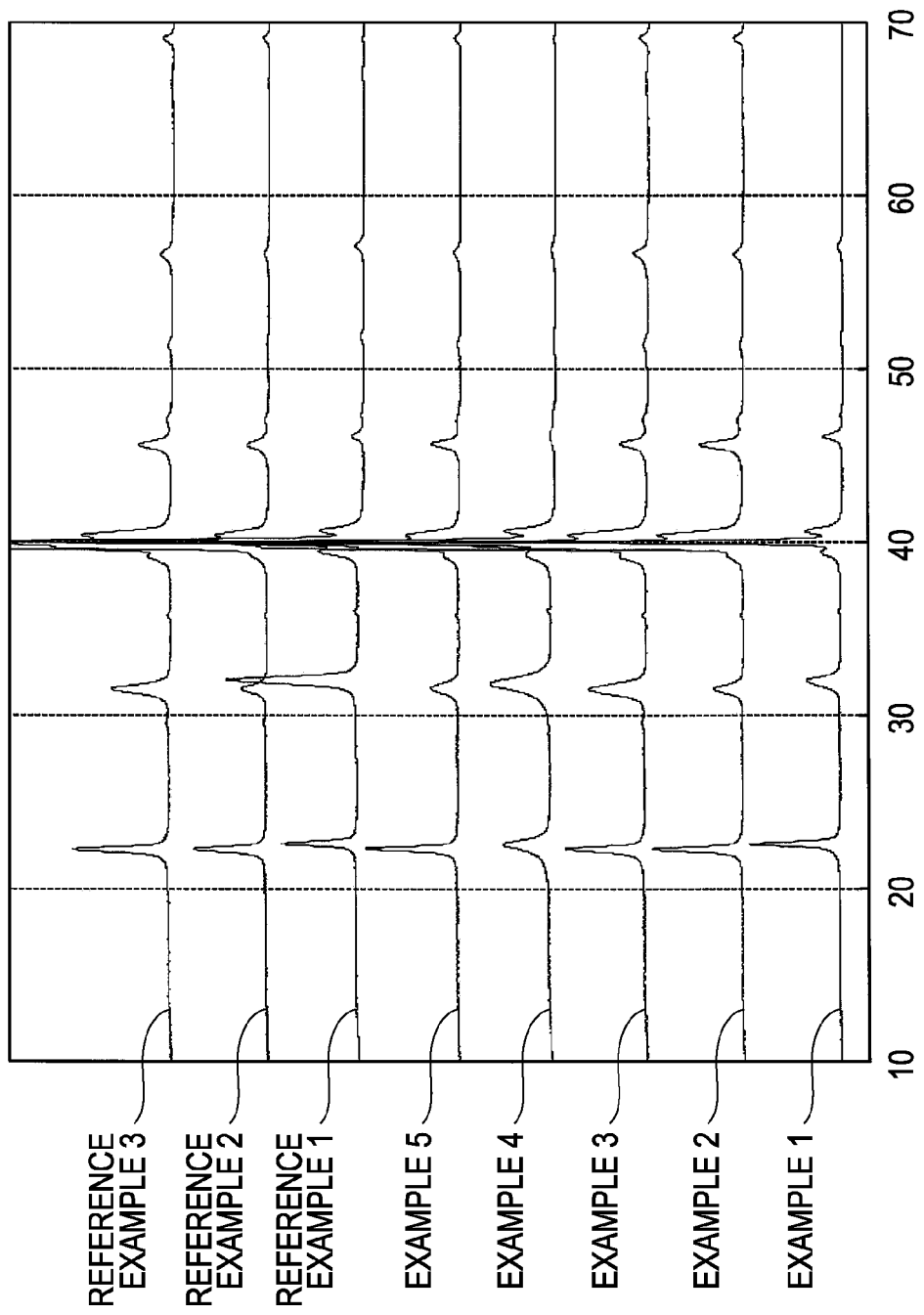

LIQUID EJECTING HEAD, LIQUID EJECTING APPARATUS, AND PIEZOELECTRIC ELEMENT

CROSS-REFERENCE TO RELATED APPLICATIONS

This application claims the benefit of priority to Japanese Patent Application No. 2010-052831 filed Mar. 10, 2010, the contents of which are hereby incorporated by reference in their entirety.

BACKGROUND

1. Technical Field

The present invention relates to a liquid ejecting head, a liquid ejecting apparatus, and a piezoelectric element.

2. Related Art

Liquid ejecting heads are used as components of liquid ejecting apparatuses, for example, in ink jet printers. In such cases, the liquid ejecting heads are used for discharging droplets of ink and letting them fly. By doing so, the ink jet printers can perform printing by letting the ink adhere to printing media, such as paper.

The liquid ejecting heads usually have actuators for applying a voltage to liquid for discharging the liquid from nozzles. Some of these actuators have, for example, piezoelectric elements. The piezoelectric elements of the actuators may have a structure in which a piezoelectric body made of a piezoelectric material having an electromechanical conversion function, such as crystallized piezoelectric ceramics, is disposed between two electrodes. Such a piezoelectric element can deform by being applied with a voltage by the two electrodes and can operate the actuator, for example, in a deformation vibration mode by means of the deformation.

The piezoelectric material to be used in such an application preferably has high piezoelectric properties, such as electromechanical conversion efficiency. Since lead titanate zirconate (PZT) materials are excellent in the properties, compared to other materials, they have been researched and developed. However, recently, there has been a demand for further improving the piezoelectric properties of piezoelectric materials, and there is a requirement for using materials having less environmental loads. The PZT materials are difficult to meet these requirements, and, for example, perovskite-type oxides, which have low lead contents, have been developed as piezoelectric materials.

Some ceramic materials, which are logically thought to have high piezoelectric properties, are Bi-based oxides, for example, and it is currently known that $BiFeO_3$ forms a perovskite-type crystal structure by being fired in a bulk form at ordinary pressure. Many of other Bi-based oxides form perovskite-type crystal structures at high pressure, higher than several gigapascals (Gpa), but do not form the perovskite-type crystal structures when they are fired under an atmosphere of ordinary pressure. For example, $Bi(Zn_{0.5}, Ti_{0.5})O_3$ (BZT) is known to form a perovskite-type crystal structure only when it is fired at high pressure (about 6 GPa).

JP-A-2009-256186 discloses a mixed oxide not containing alkali metals and lead. In JP-A-2009-256186, oxides having specific compositions have been evaluated for Curie temperatures, etc., and it is described that a piezoelectric material having an excellent piezoelectric property and a high Curie temperature can be provided.

SUMMARY

An advantages of some aspects of the invention is to provide a piezoelectric actuator having a low environmental load and a satisfactory dielectric strength, and an advantage of some aspects of the invention is to provide a liquid ejecting head having the piezoelectric actuator. Another advantage of some aspects of the invention is to provide a piezoelectric element including a piezoelectric body having a low environmental load.

The invention can be achieved as the following aspects or application examples.

Application Example 1

A liquid ejecting head according to an aspect of the invention includes a piezoelectric actuator having a piezoelectric body formed by a thin-film forming process and an electrode for applying a voltage to the piezoelectric body. The piezoelectric body contains a solid solution of bismuth lanthanum titanate zincate and lead titanate, and the molar ratio of the bismuth lanthanum titanate zincate to the lead titanate (bismuth lanthanum titanate zincate/lead titanate) in the piezoelectric body is 0.39 or more and 0.61 or less.

The liquid ejecting head according to this application example includes a bismuth-based mixed oxide having a smaller lead content, compared to the lead content in PZT, and has a satisfactory dielectric strength. By doing so, the environmental load can be reduced, and the displacement in the piezoelectric actuator can be increased, resulting in, for example, an increase in ink discharging performance in ink jet printing.

Application Example 2

In the liquid ejecting head according to application example 1, the molar ratio of bismuth to lanthanum (bismuth/lanthanum) of the bismuth lanthanum titanate zincate may be 1.00 or more and 2.33 or less.

In the liquid ejecting head according to this application example, the piezoelectric property of the piezoelectric body is further enhanced to provide a more satisfactory hysteresis property.

Application Example 3

In the liquid ejecting head according to application example 1 or 2, the molar ratio of titanium to lead (lead/titanium) in the lead titanate may be larger than 1.0 and not larger than 1.1.

The liquid ejecting head according to this application example can perform more satisfactory electromechanical conversion due to the further improved crystal structure of the piezoelectric body, resulting in, for example, an increase in ink discharging performance in ink jet printing.

Application Example 4

In the liquid ejecting head according to any one of application examples 1 to 3, the electrode includes a pair of opposing electrically conductive layers, the piezoelectric body is arranged between the pair of electrically conductive layers in a thin film state, and the piezoelectric body has a thickness of 100 nm or more and 3 µm or less.

The liquid ejecting head according to this application example can perform more satisfactory electromechanical conversion due to the further improved perovskite crystal structure of the piezoelectric body, resulting in, for example, an increase in ink discharging performance in ink jet printing.

Application Example 5

In the liquid ejecting head according to application example 4, the electric field intensity at which electrical breakdown of the piezoelectric body occurs by applying voltage between the pair of electrically conductive layers can be 500 kV/cm or more and 2000 kV/cm or less.

The liquid ejecting head according to this application example includes a piezoelectric body having a significantly high dielectric strength, which can let the displacement of the piezoelectric actuator large, resulting in, for example, an increase in ink discharging performance in ink jet printing.

Application Example 6

A liquid ejecting apparatus according to an aspect of the invention includes the liquid ejecting head according to any one of application examples 1 to 5.

The liquid ejecting apparatus according to this application example includes a piezoelectric body composed of a bismuth-based mixed oxide having a smaller lead content, compared to the lead content in PZT, and a satisfactory dielectric strength. By doing so, the environmental load can be reduced, and, for example, ink discharging performance in ink jet printing is high.

Application Example 7

A piezoelectric element according to an aspect of the invention includes a pair of opposing electrically conductive layers, a piezoelectric body arranged between the pair of electrically conductive layers. The piezoelectric body is composed of a solid solution of bismuth lanthanum titanate zincate and lead titanate, and the molar ratio of the bismuth lanthanum titanate zincate to the lead titanate (bismuth lanthanum titanate zincate/lead titanate) in the solid solution is 0.39 or more and 0.61 or less.

The piezoelectric element according to this application example includes a piezoelectric body made of a bismuth-based mixed oxide and, thereby, can have a satisfactory dielectric strength.

BRIEF DESCRIPTION OF THE DRAWINGS

The invention will be described with reference to the accompanying drawings, wherein like numbers reference like elements.

FIG. 13 shows XRD patterns in Examples 1 to 5 and Reference Examples 1 to 3.

DESCRIPTION OF EXEMPLARY EMBODIMENTS

Preferred embodiments of the invention will be described below with reference to the drawings. The embodiments described below merely describe examples of the invention. Therefore, the invention is not limited to the following embodiments and can include various modifications performed within the scope of the invention. Note that not all compositions described in the following embodiments are essential compositions.

1. Piezoelectric Element and Piezoelectric Actuator

Figure 1:
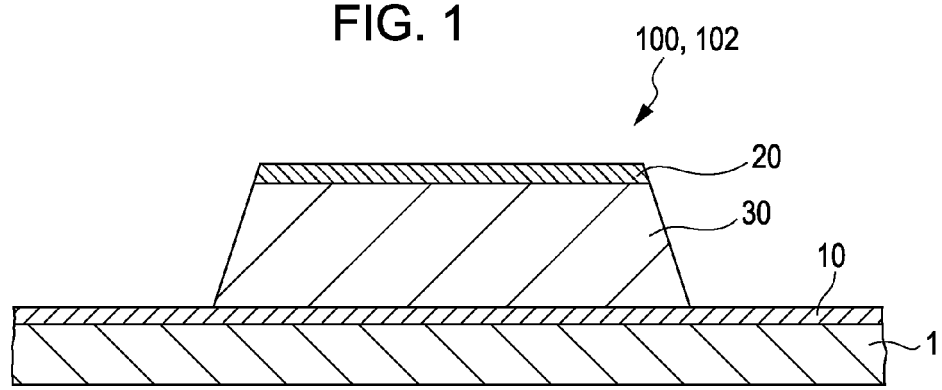
FIG. 1 is a schematic diagram illustrating a cross section of the piezoelectric element (piezoelectric actuator) according to an embodiment.

FIG. 1 is a schematic diagram illustrating a cross section of the piezoelectric element 100 according to this embodiment.

The piezoelectric element 100 according to the embodiment includes a first electrically conductive layer 10, a second electrically conductive layer 20, and a piezoelectric body 30.

1.1. First Electrically Conductive Layer

The first electrically conductive layer 10 is formed, for example, above a substrate 1. The substrate 1 may be a plate made of, for example, an electrically conductive, semiconductive, or insulating material. The substrate 1 may be a single layer or has a laminate structure composed of a plurality of layers. The substrate 1 may have any inner structure as long as its upper surface has a planar shape. For example, the substrate 1 may have a structure having a hollow inside. Furthermore, for example, when a pressure chamber and so on are formed below the substrate 1, as a liquid ejecting head described below, the substrate 1 and the components disposed below the substrate 1 may be collectively regarded as a single substrate 1.

The substrate 1 may serve as a diaphragm having flexibility and capable of deforming (bending) depending on behavior of the piezoelectric body 30. In such a case, the piezoelectric element 100 is a piezoelectric actuator 102 having the diaphragm, the first electrically conductive layer 10, the piezoelectric body 30, and the second electrically conductive layer 20. In this specification, it is recognized that the substrate 1 has flexibility when it can bend. When the substrate 1 serves as a diaphragm, a degree of bending of the substrate 1 that allows the pressure chamber to change its volume to an extent equivalent to the volume of a liquid to be discharged is sufficient for using the piezoelectric actuator 102 in a liquid ejecting head.

When the substrate 1 serves as a diaphragm, the material for the substrate 1 may be an inorganic oxide, such as zirconium oxide ($ZrO_2$), silicon nitride, or silicon oxide, or an alloy, such as stainless steel, for example. Among them, zirconium oxide is preferred as the material for the substrate 1 (diaphragm) from the viewpoints of chemical stability and rigidity. In also this case, the substrate 1 may have a laminate structure composed of two or more of the exemplified materials.

In this embodiment, a case in that the substrate 1 serves as a diaphragm and is made of zirconium oxide will be described below as an example. Therefore, the piezoelectric element 100 is substantially the same as a piezoelectric actuator 102 provided with a diaphragm having flexibility and capable of deforming (bending) depending on behavior of the piezoelectric body 30. In the following descriptions, the term "piezoelectric element 100" and the term "piezoelectric actuator 102" can be used as the same meaning.

The shape of the first electrically conductive layer 10 is not limited as long as it can oppose the second electrically conductive layer 20. In this embodiment, since the piezoelectric body 30 is formed in a thin film form, the first electrically conductive layer 10 preferably has a layer-like or thin-film-like shape. The thickness of the first electrically conductive layer 10 may be, for example, from 50 to 300 nm. Furthermore, the planar shape of the first electrically conductive layer 10 is not particularly limited as long as it allows the first electrically conductive layer 10 oppose the second electrically conductive layer 20 with the piezoelectric body 30 therebetween, and may be a rectangle or a circle, for example.

A function of the first electrically conductive layer 10 is to serve as one electrode for applying a voltage to the piezoelectric body 30 by pairing with the second electrically conductive layer 20 (for example, as a lower electrode formed below the piezoelectric body 30). The first electrically conductive layer 10 may be provided with a function of controlling crystalline orientation when the piezoelectric body 30 is crystallized.

Examples of the material for the first electrically conductive layer 10 include various types of metals, such as nickel, iridium, and platinum, electrically conductive oxides thereof (for example, iridium oxide), mixed oxides of strontium and ruthenium ($SrRuO_x$:SRO), and mixed oxides of lanthanum and nickel ($LaNiO_x$:LNO). The first electrically conductive layer 10 may have a single layer structure of a material exemplified above or a laminated structure of a plurality of materials.

1.2. Second Electrically Conductive Layer

The second electrically conductive layer 20 is arranged so as to oppose the first electrically conductive layer 10. The second electrically conductive layer 20 may entirely oppose the first electrically conductive layer 10 or may partially oppose the first electrically conductive layer 10. The shape of the second electrically conductive layer 20 is not limited as long as it can oppose the first electrically conductive layer 10. In this embodiment, since the piezoelectric body 30 is formed in a thin film form, the second electrically conductive layer 20 preferably has a layer-like or thin-film-like shape. The thickness of the second electrically conductive layer 20 may be, for example, from 50 to 300 nm. Furthermore, the planar shape of the second electrically conductive layer 20 is not particularly limited as long as it allows the second electrically conductive layer 20 oppose the first electrically conductive layer 10 with the piezoelectric body 30 therebetween, and may be a rectangle or a circle, for example.

A function of the second electrically conductive layer 20 is to serve as one electrode for applying a voltage to the piezoelectric body 30 (for example, as an upper electrode formed above the piezoelectric body 30). The second electrically conductive layer 20 may be provided with a function of controlling crystalline orientation when the piezoelectric body 30 is crystallized. Examples of the material for the second electrically conductive layer 20 may be the same as those of the above-described first electrically conductive layer 10.

In FIG. 1, the first electrically conductive layer 10 is larger than the second electrically conductive layer 20 in a planar view, but the second electrically conductive layer 20 may be larger than the first electrically conductive layer 10 in a planar view. In the latter case, the second electrically conductive layer 20 may be formed on the side face of the piezoelectric body 30 and can also have a function of protecting the piezoelectric body 30 from moisture, hydrogen, etc.

1.3. Piezoelectric Body

The piezoelectric body 30 is arranged between the first electrically conductive layer 10 and the second electrically conductive layer 20. The piezoelectric body 30 may be in contact with at least one of the first electrically conductive layer 10 and the second electrically conductive layer 20. In the example shown in FIG. 1, the piezoelectric body 30 is in contact with both the first electrically conductive layer 10 and the second electrically conductive layer 20.

The piezoelectric body 30 is formed by a thin-film forming process. In this specification, the thin-film forming process refers to at least one selected from the group consisting of sputtering, vapor deposition, metal-organic chemical vapor deposition (MOCVD), metal-organic decomposition (MOD), pulsed laser deposition (PLD) (laser abrasion), misted chemical deposition, and a sol-gel process. That is, the piezoelectric body 30 according to this embodiment is not formed in a bulk state, and is not a piezoelectric body formed by, for example, polishing a bulk piezoelectric body into a thin film.

The thickness of the piezoelectric body 30 is not limited as long as the piezoelectric body 30 is formed by a thin-film forming process, and it can be 100 nm or more and 3000 nm or less, for example. In order to form the piezoelectric body 30 having a large thickness by a thin-film forming process, for example, when the process is a type of depositing a material, such as sputtering, vapor deposition, or MOCVD, the thickness can be increased by elongating the deposition time, and when the process is a type of performing coating and firing, the thickness can be increased by repeating the process to stack layers. Furthermore, when the deposition is repeated, each layer may be deposited by different thin-film forming processes. A thickness of the piezoelectric body 30 being outside the range may cause insufficient voltage resistance or insufficient deformation (electromechanical conversion).

The piezoelectric body 30 of this embodiment is a solid solution of bismuth lanthanum titanate zincate and lead titanate.

More specifically, the piezoelectric body 30 is a solid solution of bismuth lanthanum titanate zincate (Bi, La)(Zn, Ti)$O_3$ (hereinafter, this may be abbreviated as "BLZT") and lead titanate PbTi$O_3$ (hereinafter, this may be abbreviated as "PT"), and the solid solution (hereinafter, this may be abbreviated as "PT-BLZT") can be represented by, for example, the following formula:

$$(1-u)Pb_{(1+v)}TiO_3-u(Bi_{(1-w)}La_w)(Zn_{(1-x)}Ti_x)O_3 \quad \text{(Formula I)}.$$

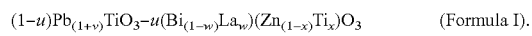

The PT-BLZT is a mixed oxide shown by a general formula: AB$O_3$, and is classified in a so-called perovskite-type oxide and can have a perovskite-type crystal structure by crystallization. The PT-BLZT can show a piezoelectric property by being crystallized so as to have a perovskite-type crystal structure. As a result, the piezoelectric body 30 can deform when it is applied with a voltage by the first electrically conductive layer 10 and the second electrically conductive layer 20 (electromechanical conversion). This deformation, for example, can bend or vibrate the substrate 1 to constitute the piezoelectric actuator 102.

When the solid solution of the piezoelectric body 30 in this embodiment is represented by the above-mentioned formula (Formula I), each of u, v, w, and x can be a value of 0 or more and 1 or less. These values may denote the feeding amounts of materials when the piezoelectric body 30 is formed or may denote the composition of a resulting piezoelectric body 30. For example, "v" in the formula can be recognized to denote the amount of lead that is fed in an amount greater than the stoichiometrical ratio in $PbTiO_3$. Therefore, the charge of the chemical formula may not be apparently neutral. In such a case, the values are recognized to show feeding amounts or degrees of defects in crystals.

The piezoelectric body 30 of this embodiment is a solid solution of bismuth lanthanum titanate zincate and lead titanate, and the molar ratio of the bismuth lanthanum titanate zincate to the lead titanate (BLZT/PT) in the solid solution is 0.39 or more and 0.61 or less. That is, when the solid solution of the piezoelectric body 30 according to the embodiment is represented by the above-mentioned formula (Formula I), the value of u satisfies $0.28 \leq u \leq 0.38$.

In the piezoelectric element 100 of this embodiment, since the molar ratio of the bismuth lanthanum titanate zincate to the lead titanate (BLZT/PT) in the solid solution of the piezoelectric body 30 within the above-mentioned range, a satisfactory dielectric strength can be obtained. As a result, the voltage to be applied to the piezoelectric element 100 can be increased, resulted in, for example, an increase in displacement of the piezoelectric actuator 102. Accordingly, such piezoelectric body 30 can enhance, for example, the ink discharging performance in ink jet printing. The BLZT/PT ratio is more preferably 0.39 or more and 0.49 or less.

In the solid solution of the piezoelectric body 30 according to the embodiment, the molar ratio of bismuth to lanthanum (Bi/La) in the bismuth lanthanum titanate zincate may be 1.00 or more and 2.33 or less. That is, when the solid solution of the piezoelectric body 30 according to the embodiment is represented by the above-mentioned formula (Formula I), the value of w can be adjusted to $0.3 \leq w \leq 0.5$. By doing so, the hysteresis loop of the piezoelectric element 100 can have a more satisfactory shape. That is, when the Bi/La ratio is 1.00 to 2.33, the hysteresis loop can have a broad width. The Bi/La ratio is more preferably 1.5 or more and 2.33 or less.

In the piezoelectric body 30 according to this embodiment, the molar ratio of lead to titanium (lead/titanium) can be larger than 1.0 and not larger than 1.1. In addition, in the piezoelectric body 30, the amount of lead of lead titanate in the solid solution may be in excess by at most 10% of the amount of lead of lead titanate having a stoichiometrical composition. That is, when the solid solution of the piezoelectric body 30 according to the embodiment is represented by the above-mentioned formula (Formula I), the value of v can be adjusted to $0 \leq v \leq 0.1$. By doing so, the amounts of different phases in the crystals of the solid solution can be decreased. For example, when the piezoelectric body 30 is crystallized, phases of crystal structures such as cubical crystals, tetragonal crystals, and rhombohedral crystals may appear. By adjusting the molar ratio of lead to titanium (lead/titanium) in lead titanate to a ratio of larger than 1.0 and not larger that 1.1, for example, the ratio of tetragonal crystals in the piezoelectric body 30 can be increased, and the amounts of other phases (different phases) having other crystal structures can be reduced. By doing so, the piezoelectric property of the piezoelectric element 100 can be further improved.

In the solid solution of the piezoelectric body 30 according to this embodiment, the molar ratio of zinc to titanium (Zn/Ti) in bismuth lanthanum titanate zincate may be 0.92 or more and 1.08 or less. That is, when the solid solution of the piezoelectric body 30 according to the embodiment is represented by the above-mentioned formula (Formula I), the value of x can be adjusted to $0.48 \leq x \leq 0.5$. By doing so, the piezoelectric element 100 can have a more satisfactory dielectric strength. As a result, the piezoelectric element 100 can be applied with a higher voltage, and, therefore, for example, the displacement of the piezoelectric actuator 102 can be further increased, resulting in, for example, a further enhancement in ink discharging performance in ink jet printing. The Zn/Ti ratio is more preferably 0.96 or more and 1.04 or less, and is most preferably 0.5 from the viewpoint of balance in number of valences of bismuth, zinc, and titanium.

1.4. Function, Effect, Etc.

The piezoelectric element 100 (piezoelectric actuator 102) according to this embodiment includes the above-described piezoelectric body 30 and, therefore, characteristically has, at least, a high voltage resistance, namely, a high electric field intensity at which electrical breakdown occurs by applying voltage between the first electrically conductive layer 10 and the second electrically conductive layer 20. The electric field intensity at which the electrical breakdown occurs is very high in the piezoelectric element 100 of the embodiment, for example, 500 kV/cm or more and 2000 kV/cm or lees. This will be described in more detail by examples described below.

It has been revealed that even though the PT-BLZT according to the embodiment has a low lead content (53 to 61% by mass) compared to PZT (lead content: about 76% by mass), a very satisfactory property can be obtained. That is, the PT-BLZT according to the embodiment can be lowered in environmental load and can show an excellent piezoelectric property.

The piezoelectric element 100 according to this embodiment can be used in broad application. Examples of use as a piezoelectric actuator 102 include liquid ejecting heads and liquid ejecting apparatuses such as ink jet printers, and examples of preferred use as a piezoelectric element 100 include various types of sensors such as gyrosensors and acceleration sensors, timing devices such as tuning fork vibrators, and ultrasonic devices such as ultrasonic motors.

2. Method of Producing Piezoelectric Element

The piezoelectric element 100 according to an aspect of the invention can be produced by, for example, as follows.

First, a substrate 1 is prepared, and a first electrically conductive layer 10 is formed on the substrate 1. The first electrically conductive layer 10 can be formed by, for example, sputtering, plating, or vacuum vapor deposition. The first electrically conductive layer 10 may be patterned according to need.

Then, a piezoelectric body 30 is formed on the first electrically conductive layer 10. The piezoelectric body 30 can be formed as described above by, for example, sputtering, vapor deposition, metal-organic chemical vapor deposition (MOCVD), metal-organic decomposition (MOD), pulsed laser deposition (PLD) (laser abrasion), misted chemical deposition, or a sol-gel process, or combination of these methods. Crystallization of the piezoelectric body 30 can be performed, for example, under an oxygen atmosphere at a temperature of 500 to 800° C. Thus, the piezoelectric body 30 can be crystallized. The crystallization may be performed after patterning of the piezoelectric body 30. The piezoelectric body 30 can have a desired thickness by repeating the procedure several times according to need.

Then, a second electrically conductive layer 20 is formed on the piezoelectric body 30. The second electrically conductive layer 20 can be formed by, for example, sputtering, plating, or vacuum vapor deposition. A piezoelectric element is formed by patterning the second electrically conductive layer 20 and the piezoelectric body 30 into a desired shape. The second electrically conductive layer 20 and the piezoelectric body 30 can be simultaneously patterned according to need.

The piezoelectric element 100 according to the embodiment can be produced by the process exemplified above.

3. Liquid Ejecting Head

Figure 2:
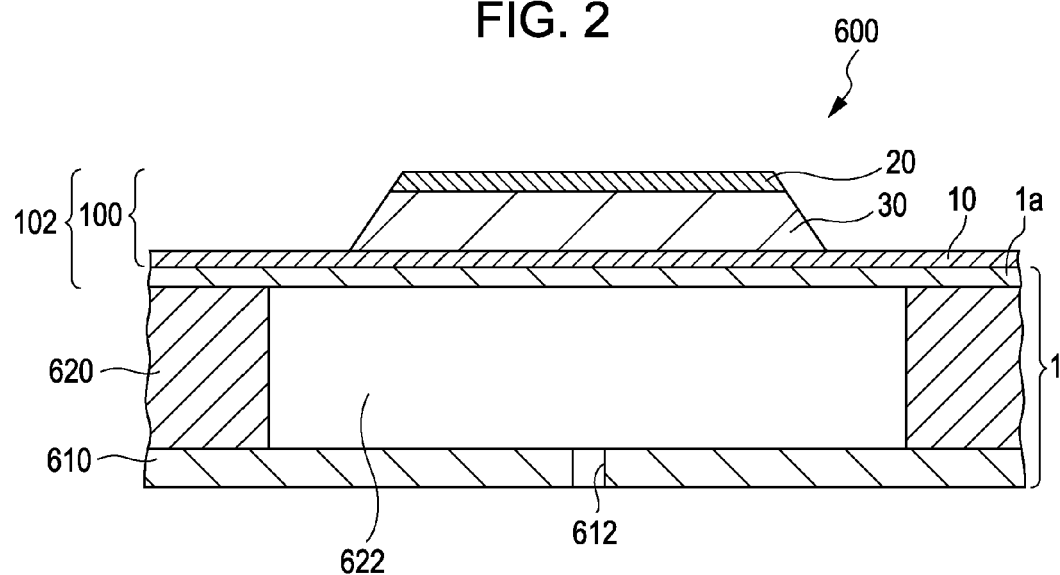
FIG. 2 is a schematic diagram illustrating a cross section of the liquid ejecting head according to an embodiment.
Figure 3:
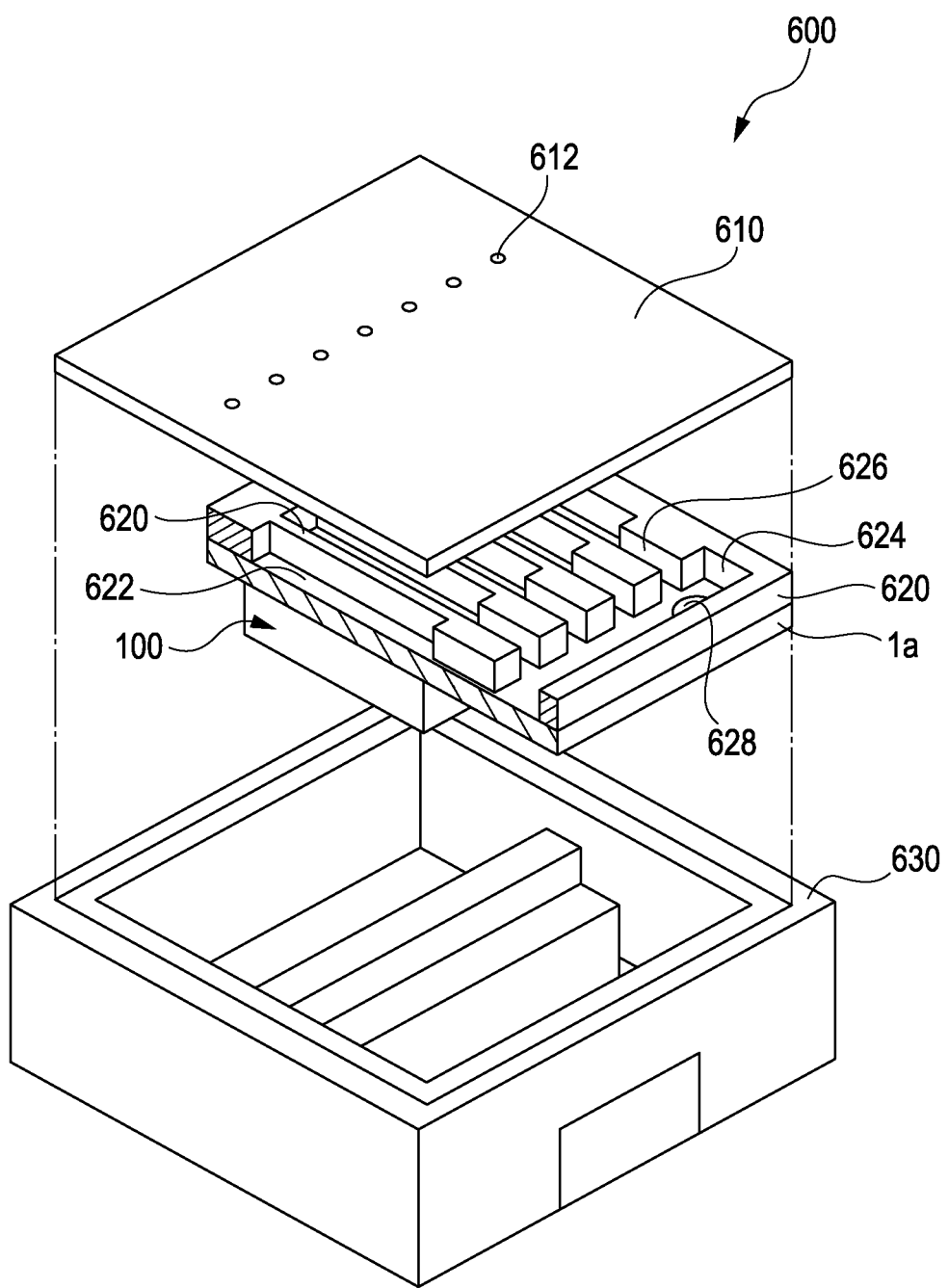
FIG. 3 is an exploded perspective view schematically illustrating the liquid ejecting head according to the embodiment.

As an example of use of the piezoelectric element (piezoelectric actuator) according to the embodiment, a liquid ejecting head 600 having the piezoelectric element (piezoelectric actuator) will be described below with reference to the drawings. FIG. 2 is a cross-sectional view schematically illustrating the main portion of the liquid ejecting head 600. FIG. 3 is an exploded perspective view of the liquid ejecting head 600, shown upside down from its usual state being used.

The liquid ejecting head 600 can have the above-described piezoelectric element (piezoelectric actuator). In the following example, it will be described a piezoelectric actuator 600 including a piezoelectric element 100 formed on a substrate 1 (a structure having a diaphragm 1a at the upper portion), wherein the piezoelectric element 100 and the diaphragm 1a constitute a piezoelectric actuator 102.

As shown in FIGS. 2 and 3, the liquid ejecting head 600 includes a nozzle plate 610 having nozzle holes 612, a pressure chamber substrate 620 for forming pressure chambers 622, and the piezoelectric element 100. Furthermore, as shown in FIG. 3, the liquid ejecting head 600 may have a housing 630. Note that FIG. 3 shows the piezoelectric element 100 in a simplified form.

As shown in FIGS. 2 and 3, the nozzle plate 610 has the nozzle holes 612. Ink can be discharged through the nozzle holes 612. The nozzle plate 610 is provided with, for example, a large number of nozzle holes 612 aligned in a line. Examples of the material for the nozzle plate 610 include silicon and stainless steel (SUS).

The pressure chamber substrate 620 is disposed on (in the example shown in FIG. 3, under) the nozzle plate 610. Examples of the material for the pressure chamber substrate 620 include silicon. As shown in FIG. 3, a reservoir (liquid reserving portion) 624, feeding apertures 626 communicating with the reservoir 624, and the pressure chambers 622 communicating with the respective feeding apertures 626 are provided by partitioning space between the nozzle plate 610 and the diaphragm 1a by the pressure chamber substrate 620. In this example, the reservoir 624, the feeding apertures 626, and the pressure chambers 622 will be separately described, but each of them is a channel for a liquid and may be designed in any manner. For example, the feeding apertures 626 in the example shown in the drawing each have a shape in which part of the channel is narrowed, but it may be appropriately shaped according to its design, and the structure of the example is not essential. The reservoir 624, the feeding apertures 626, and the pressure chambers 622 are partitioned by the nozzle plate 610, the pressure chamber substrate 620, and the diaphragm 1a. The reservoir 624 can temporally reserve ink that is supplied from the outside (for example, an ink cartridge) through a via-hole 628 provided in the diaphragm 1a. The ink in the reservoir 624 can be supplied to the pressure chambers 622 through the feeding apertures 626. The volumes of the pressure chambers 622 are changed by deformation of the diaphragm 1a. The pressure chambers 622 are communicated with the nozzle holes 612, and ink or the like is discharged from the nozzle holes 612 by the change in the volumes of the pressure chambers 622.

The piezoelectric element 100 is disposed on (in the example of FIG. 3, under) the pressure chamber substrate 620. The piezoelectric element 100 is electrically connected to a piezoelectric element driving circuit (not shown) and can be operated (vibrated or deformed) based on signals from the piezoelectric element driving circuit. The diaphragm 1a is deformed by behavior of the piezoelectric body 30 to appropriately change the inner pressures of the pressure chambers 622.

As shown in FIG. 3, the housing 630 can store the nozzle plate 610, the pressure chamber substrate 620, and the piezoelectric element 100. Examples of the material for the housing 630 include resins and metals.

The liquid ejecting head 600 includes the above-described piezoelectric element 100 having, at least, an excellent voltage resistance. Therefore, the liquid ejecting head 600 has a high voltage resistance to allow operation at a higher voltage compared to known liquid ejecting heads and has a high ability of discharging liquid, for example.

Here, a case in that the liquid ejecting head 600 is an ink jet recording head has been described. However, the liquid ejecting head according to the embodiment can be also used as, for example, a color material ejecting head used for producing color filters of liquid crystal displays, etc., an electrode-material ejecting head used for forming electrodes of organic electroluminescent (EL) displays, field emission displays (FEDs), etc., and a bio-organic-matter ejecting head used for producing bio-chips.

4. Liquid Ejecting Apparatus

Figure 4:
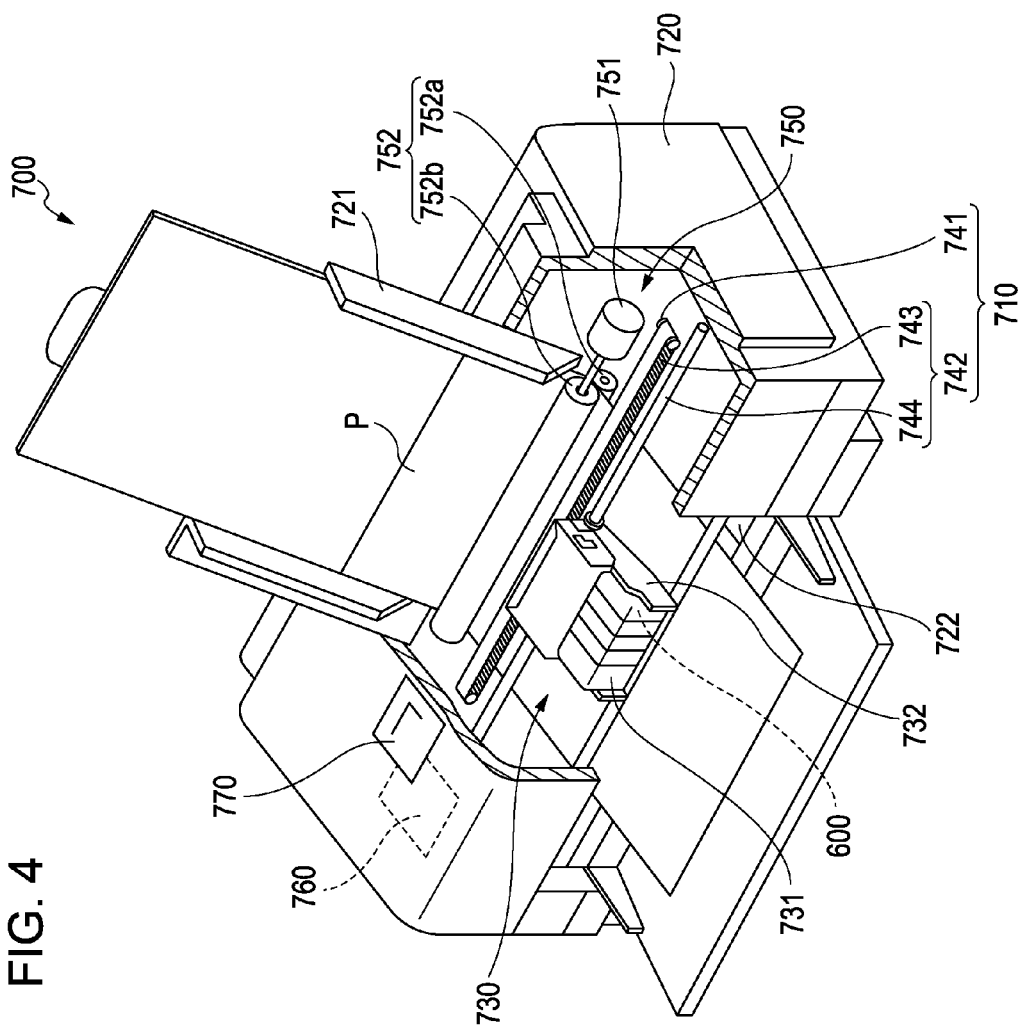
FIG. 4 is a perspective view schematically illustrating a liquid ejecting apparatus according to an embodiment.

A liquid ejecting apparatus according to an embodiment will be described with reference to the drawing. The liquid ejecting apparatus includes the above-described liquid ejecting head. Hereinafter, an ink jet printer having the above-described liquid ejecting head will be described as the liquid ejecting apparatus. FIG. 4 is a perspective view schematically illustrating the liquid ejecting apparatus 700 according to the embodiment.

As shown in FIG. 4, the liquid ejecting apparatus 700 includes a head unit 730, a driving portion 710, and a controller 760. The liquid ejecting apparatus 700 can further include an apparatus body 720, a paper feeding portion 750, a tray 721 for setting recording paper P, a discharge port 722 for discharging the recording paper P, and an operation panel 770 disposed on the upper surface of the apparatus body 720.

The head unit 730 includes an ink jet recording head (hereinafter, also simply referred to as "head") constituted of the above-described liquid ejecting head 600. The head unit 730 further includes an ink cartridge 731 supplying ink to the head and a transporting portion (carriage) 732 equipped with the head and the ink cartridge 731.

The driving portion 710 can allow the head unit 730 to reciprocate. The driving portion 710 includes a carriage motor 741 serving as a driving source of the head unit 730 and a reciprocation mechanism 742 for letting the head unit 730 reciprocate with the rotation of the carriage motor 741.

The reciprocation mechanism 742 includes a carriage guide shaft 744 supported by a frame (not shown) at both ends and a timing belt 743 extending parallel to the carriage guide shaft 744. The carriage guide shaft 744 supports the carriage 732 in such a manner that the carriage 732 can freely reciprocate. Furthermore, the carriage 732 is fixed to a part of the timing belt 743. The head unit 730 reciprocates along the carriage guide shaft 744 by means of the timing belt 743 that runs by operation of the carriage motor 741. During this reciprocating movement, ink is appropriately discharged from the head to perform printing on the recording paper P.

In the embodiment, an example of the liquid ejecting apparatus in which both the liquid ejecting head 600 and the recording paper P are moved when printing is performed has been described, but the liquid ejecting apparatus of the invention is not limited thereto as long as the apparatus has a mechanism in which printing on recording paper P is performed by changing the relative position between the liquid ejecting head 600 and the recording paper P. Furthermore, though the embodiment shows an example in which printing is performed on the recording paper P, the recording medium on which printing is performed by the liquid ejecting apparatus of the invention is not limited to paper, and examples of the recording medium include various media, such as cloth, films, and metals, and the constitution can be appropriately modified.

The controller 760 can control the head unit 730, the driving portion 710, and the paper feeding portion 750.

The paper feeding portion 750 can transport the recording paper P to the head unit 730 side from the tray 721. The paper feeding portion 750 includes a paper feeding motor 751 serving as a driving source and paper feeding rollers 752 being rotated by operation of the paper feeding motor 751. The paper feeding rollers 752 are a driven roller 752a and a driving roller 752b that vertically oppose each other with a feeding path of the recording paper P therebetween. The driving roller 752b is connected to the paper feeding motor 751. The paper feeding portion 750 is driven by the controller 760 to transport the recording paper P so as to pass under the head unit 730.

The head unit 730, the driving portion 710, the controller 760, and the paper feeding portion 750 are disposed inside the apparatus body 720.

The liquid ejecting apparatus 700 includes the liquid ejecting head 600 having a high voltage resistance. Therefore, the liquid ejecting apparatus 700 can have a high liquid-discharging ability.

The liquid ejecting apparatus 700 exemplified above includes one liquid ejecting head 600 and can perform printing on a recording medium with this liquid ejecting head 600. The liquid ejecting apparatus may have a plurality of the liquid ejecting heads. When the liquid ejecting apparatus has a plurality of the liquid ejecting heads, the liquid ejecting heads may be each independently operated or may be connected to one another as one assembled head. An example of the assembled head is a line-type head in which the nozzle holes of each of the heads are aligned at equal distances as a whole.

The liquid ejecting apparatus 700 as an ink jet printer has been described above as an example of the liquid ejecting apparatus according to the invention, but the liquid ejecting apparatus according to the invention can be also industrially utilized. As the liquid (liquid-like material) to be discharged in such a case, for example, various functional materials having viscosities that are appropriately adjusted with solvents or dispersing media can be used. The liquid ejecting apparatus according to the invention can be also suitably used as a color-material ejecting apparatus used for producing color filters of liquid crystal displays, etc., a liquid-material ejecting apparatus used for forming electrodes or color filters of organic EL displays, field emitting displays (FEDs), electrophoresis displays, etc., and a bio-organic-material ejecting apparatus used for producing bio-chips, in addition to the image recording apparatus such as the exemplified printer.

5. Example and Reference Example

The invention will be more specifically described by showing examples and reference examples, but is not limited to the following examples at all.

5.1. Production of Piezoelectric Element

Piezoelectric elements of Examples 1 to 4 and Reference Examples 1 to 3 were produced as follows.

First, a substrate was produced by the following process. Silicon dioxide serving as an insulating film was produced on a monocrystal silicon substrate by thermal oxidation of the substrate. On this substrate, a TiAlN film having a thickness of 50 nm, an iridium (Ir) film having a thickness of 100 nm, an iridium oxide (IrOx) film having a thickness of 30 nm, and a platinum (Pt) film having a thickness of 150 nm were sequentially formed by RF magnetron sputtering. This layered product corresponds to the first electrically conductive layer 10 in the above-described embodiment.

The piezoelectric body 30 of each of Examples and Reference Examples was produced by chemical solution deposition. PT-BLZT precursor solutions having different compositions for the respective Examples and Reference Examples were applied onto the corresponding first electrically conductive layers 10 by spin coating. The spin coating was performed at a rotation speed of 500 rpm for 5 sec first and subsequently at 3000 rpm for 30 sec.

Then, the resulting precursor films were dried at 160° C. in the atmosphere for 2 minutes for removing the solvents. Then, the precursor films were subjected to thermal treatment at 400° C. in the atmosphere for 4 minutes to remove the organic components in the precursor films (degrease). The process of application of the precursor solution, drying, and degrease was repeated three times in each of Examples and Reference Examples. Then, the samples were placed in a firing furnace (rapid thermal annealing: RTA) and were fired from 500° C. to 800° C. for 2 minutes with an oxygen flow of 0.5 L/min.

Furthermore, in each of Examples and Reference Examples, the process of application of the precursor solution, drying, and degrease was repeated three times, the firing was repeated twice, and then firing was performed from 500° C. to 800° C. for 5 minutes with an oxygen flow of 0.5 L/min. Here, the thickness of one PT-BLZT layer was 100 nm in every sample, and each piezoelectric body 30 therefore had a thickness of 600 nm.

Furthermore, a PT film serving as the second electrically conductive layer 20 having a thickness of 100 nm was formed on each piezoelectric body 30 by DC sputtering. Then, the resulting samples were placed in an RTA furnace, and baking of the second electrically conductive layer 20 was performed at 650° C. for 5 minutes with an oxygen flow of 0.5 L/min in the furnace. Thus, piezoelectric elements of Examples and Reference Examples were produced.

In Examples and Reference Examples, the chemical solution deposition was performed using precursor solutions prepared by mixing 2-ethylhexanoates of bismuth, lanthanum, and zinc (raw materials of bismuth, lanthanum, and zinc), a metal alkoxide (a raw material of titanium), and lead acetate (a raw material of lead) in a solvent (n-butanol). The compositions of the PT-BLZT precursor solutions in Examples and Reference Examples are shown as concentrations of elements contained in the raw material solutions, "mixing amount (charging amount: mol %) of each element in the raw materials", in Table 1. Table 1 also shows the values of u, v, w, and x when the compositions are represented by Formula I: $(1-u)Pb_{(1+v)}TiO_3-u(Bi_{(1-w)}La_w)(Zn_{(1-x)}Ti_x)O_3$. In addition, the amounts of Pb and Bi in excess from the stoichiometric composition (stoichiometry) in charging are also shown in Table 1. The piezoelectric element of Reference Example 1 does not contain lanthanum, but the composition thereof is represented by PT-BLZT in which w denotes 0 as a matter of convenience.

TABLE 1

|  | mol % | EXAMPLE 1 | 2 | 3 | 4 | 5 | REFERENCE EXAMPLE 1 | 2 | 3 | COMPARATIVE EXAMPLE PZT |
|---|---|---|---|---|---|---|---|---|---|---|
| Mixing amount (mol%) | Bi | 11.2 | 12.7 | 9.5 | 8 | 11.6 | 16 | 12.6 | 13 | — |
|  | La | 4.8 | 6.9 | 4.1 | 8 | 5 | — | 4.7 | 4.9 | — |
|  | Pb | 35.6 | 32.6 | 38.1 | 35.6 | 33.3 | 35.7 | 35 | 32.9 | — |
|  | Zn | 8 | 9.1 | 6.8 | 8 | 8.3 | 8 | 7.9 | 8.1 | — |
|  | Ti | 40.4 | 38.7 | 41.5 | 40.4 | 41.8 | 40.3 | 39.8 | 41.1 | — |
| Mixing ratio | BLZT/PT ratio | 0.49 | 0.61 | 0.39 | 0.49 | 0.49 | 0.49 | 0.49 | 0.49 | — |
|  | Bi/La ratio | 2.33 | 2.33 | 2.33 | 1 | 2.33 | ∞ | 2.66 | 2.66 | — |
| $(1-u)Pb_{(1+v)}TiO_3 - u(Bi_{(1-w)}La_w)(Zn_{(1-x)}Ti_x)O_3$ | | | | | | | | | | |
| Factor | u | 0.33 | 0.38 | 0.28 | 0.33 | 0.33 | 0.33 | 0.33 | 0.33 | — |
|  | v | 0.1 | 0.1 | 0.1 | 0.1 | 0 | 0.1 | 0.1 | 0 | — |
|  | w | 0.3 | 0.3 | 0.3 | 0.5 | 0.3 | 0 | 0.3 | 0.3 | — |
|  | x | 0.5 | 0.5 | 0.5 | 0.5 | 0.5 | 0.5 | 0.5 | 0.5 | — |
| Mixing amount in excess | Pb | 0.1 | 0.1 | 0.1 | 0.1 | — | 0.1 | 0.1 | — | — |
|  | Bi | — | — | — | — | — | — | 0.1 | 0.1 | — |

As Comparative Example, a piezoelectric element having a piezoelectric body made of lead titanate zirconate (PZT) was produced. The piezoelectric element of Comparative Example was produced as in Examples and Reference Examples except that a raw material solution was prepared by mixing lead acetate (a raw material of lead) and metal alkoxides of zirconium and titanium (raw materials of zirconium and titanium) in a solvent (n-butanol) and except that a process of application of the solution, drying, and degrease was repeated three times, and a process of repeating firing four times was repeated twice so that a thickness of 1300 nm was obtained.

5.2. Evaluation of Piezoelectric Element 5.2.1. Evaluation of Voltage Resistance Voltage resistance of the piezoelectric element of each Example, Reference Example, and Comparative Example was evaluated based on the results obtained by plotting displacement with respect to applied voltage and converting the resulting displacement-applied voltage plot into a plot of distortion factor with respect to electric field intensity. The displacement-applied voltage plot was obtained by patterning the piezoelectric element of each sample into a circular pattern having a diameter of 500 μm and connecting two electrodes to a displacement measuring apparatus (double beam laser interferometer: DBLI). The displacement was measured at a frequency of 1 kHz using an apparatus available from aixACCT Systems GmbH.

5.2.2. Evaluation of Hysteresis

Hysteresis was evaluated based on the shape of a hysteresis loop obtained by measurement with "FCE-1A", a product of Toyo Corporation. The sample used for the hysteresis evaluation was the same as that used for voltage resistance evaluation in each Example, Reference Example, and Comparative Example.

5.2.3. X-Ray Diffraction (XRD)

The X-ray diffraction (XRD) pattern was measured for the sample not patterned into a piezoelectric element in each Example, Reference Example, and Comparative Example using model D8 Discover, a product of Bruker AXS Inc., using Cu—Kα rays as an X-ray source at room temperature.

5.3. Evaluation Result

Figure 5:
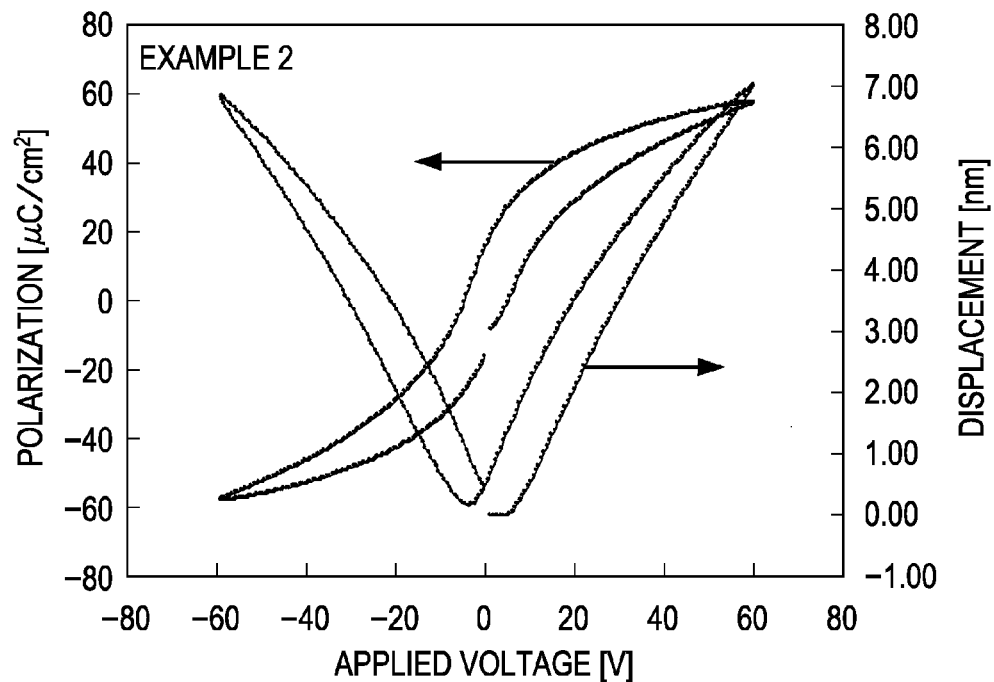
FIG. 5 is a graph plotting polarization and displacement with respect to applied voltage in the piezoelectric element of Example 2.
Figure 6:
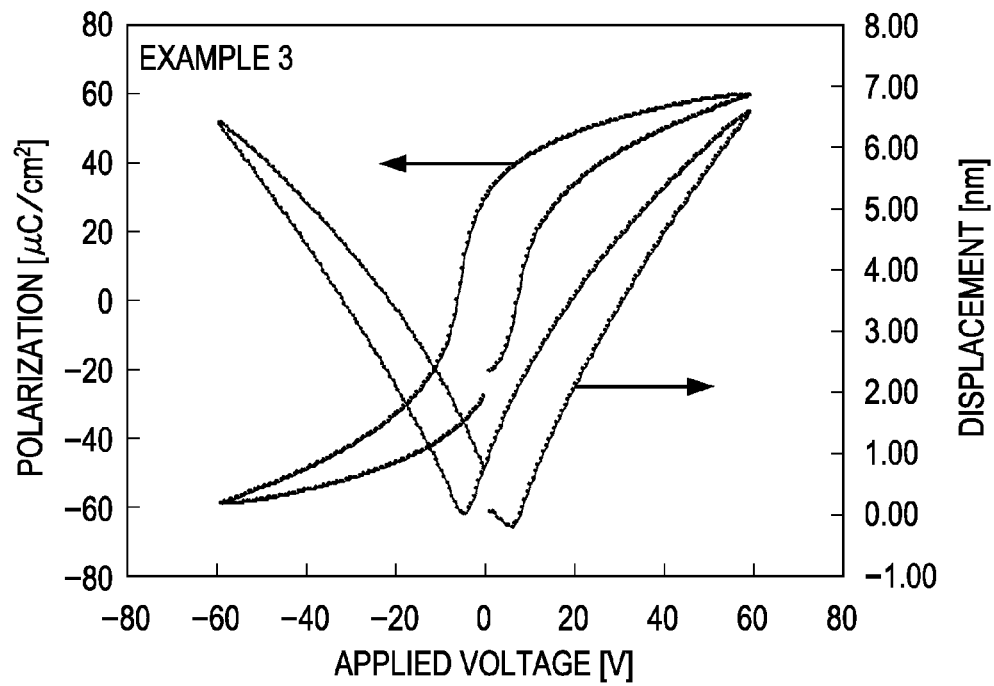
FIG. 6 is a graph plotting polarization and displacement with respect to applied voltage in the piezoelectric element of Example 3.

FIGS. 5 and 6 are graphs plotting polarization and displacement with respect to applied voltage for the piezoelectric elements of Examples 2 and 3, respectively. It is recognized from FIGS. 5 and 6 that the piezoelectric elements of Examples 2 and 3 both show satisfactory polarization curves and satisfactory displacement curves. They are not shown, but it was also confirmed that the piezoelectric elements of Examples 1, 4, and 5 and Reference Examples 1 to 3 showed satisfactory polarization curves and satisfactory displacement curves. Then, the thus-obtained displacement curves were converted into distortion factor-electric field intensity curves.

Figure 7:
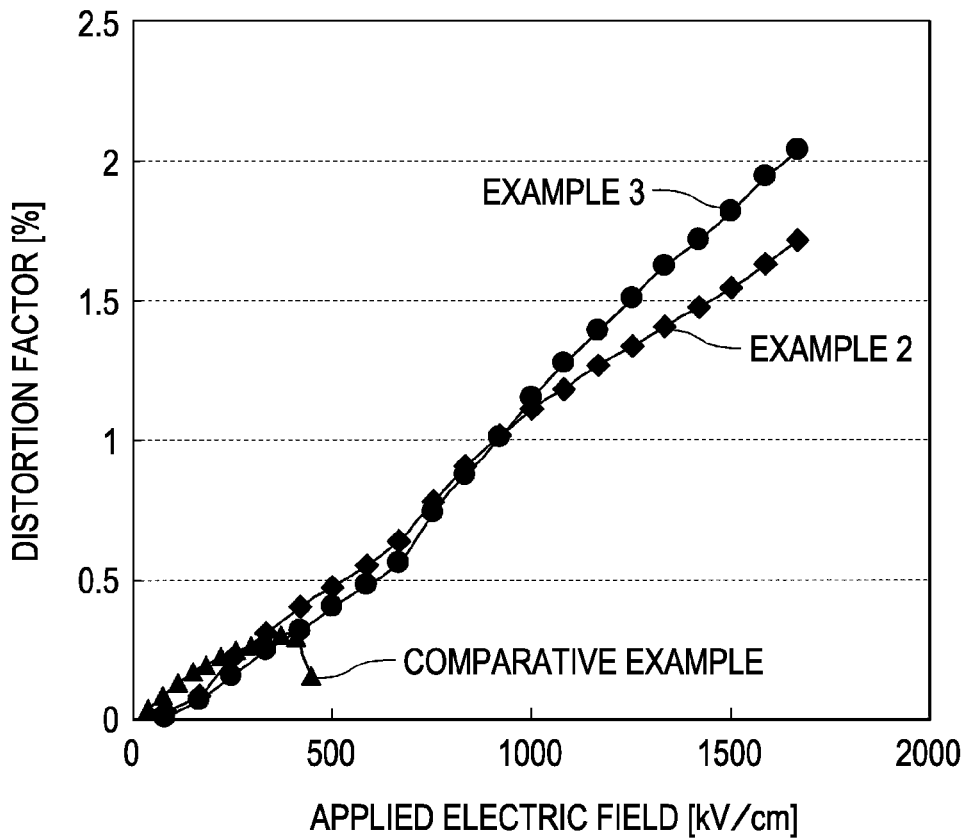
FIG. 7 is a graph plotting distortion factors with respect to electric field intensities in Examples 2 and 3 and Comparative Example.
Figure 8:
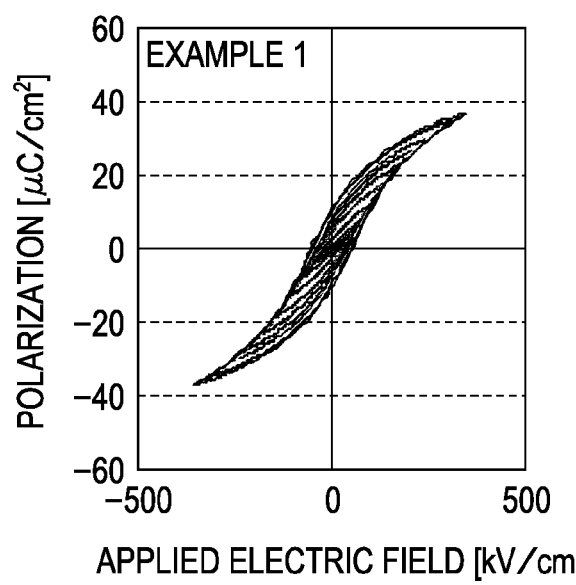
FIG. 8 is a hysteresis curve of the piezoelectric element of Example 1.
Figure 9:
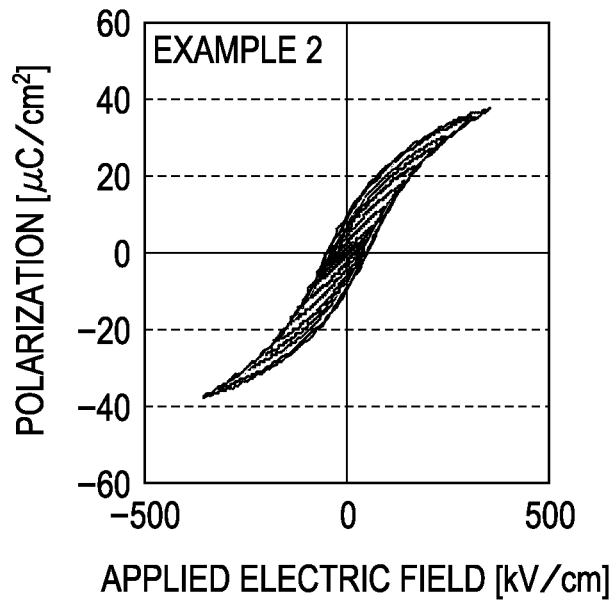
FIG. 9 is a hysteresis curve of the piezoelectric element of Example 2.
Figure 10:
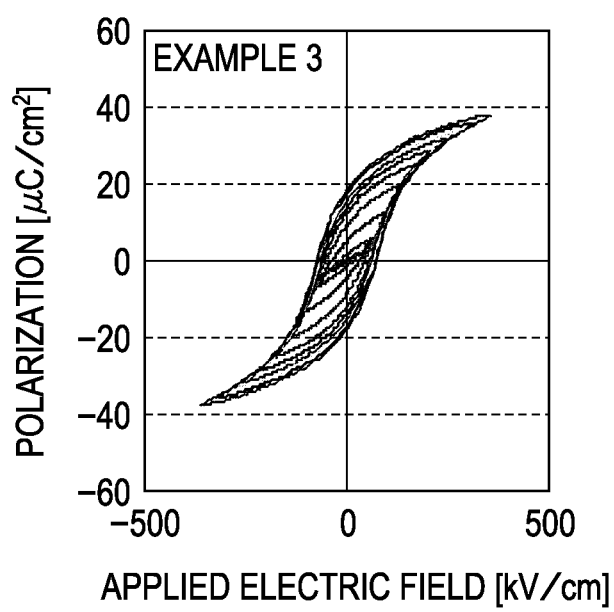
FIG. 10 is a hysteresis curve of the piezoelectric element of Example 3.
Figure 11:
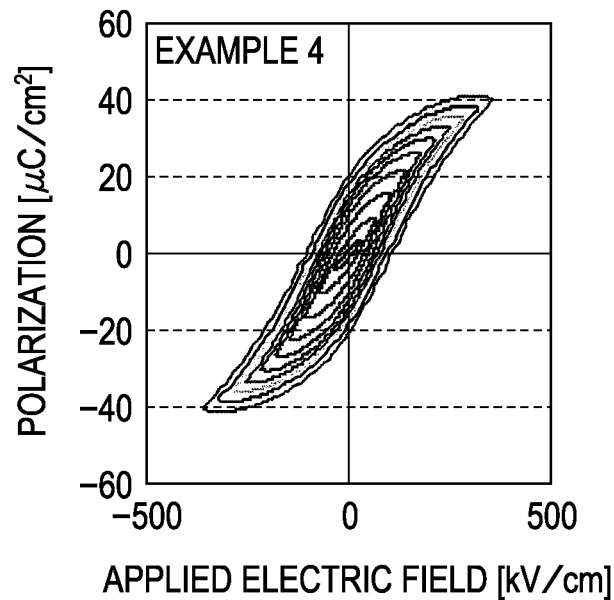
FIG. 11 is a hysteresis curve of the piezoelectric element of Example 4.
Figure 12:
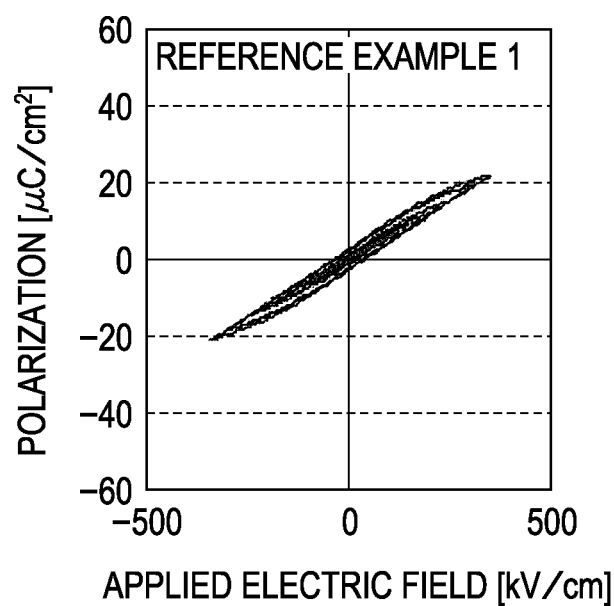
FIG. 12 is a hysteresis curve of the piezoelectric element of Reference Example 1.

FIG. 7 is a graph plotting distortion factor with respect to electric field intensity of each piezoelectric element of Examples 2 and 3 and Comparative Example. It is revealed from FIG. 7 that the piezoelectric elements of Examples 2 and 3 each showed a distortion factor of 1.5% or more at an electric field intensity of 1700 kV/cm or more. This means that the piezoelectric elements having piezoelectric bodies made of PT-BLZT of Examples 2 and 3 each have a significantly excellent voltage resistance and each achieve a very high distortion factor. They are not shown, but it was also confirmed that the piezoelectric elements of Examples 1, 4, and 5 and Reference Examples 1 to 3 showed the same results as those of Examples 2 and 3. However, the piezoelectric element of Comparative Example, that is, the piezoelectric element having the piezoelectric body made of PZT was electrically broken down at an electric field intensity less than 500 kV/cm.

FIGS. 8 to 12 show hysteresis curves of the piezoelectric elements of Examples 1 to 4 and Reference Example 1, respectively. It was revealed from FIGS. 8 to 11 that the hysteresis loops of the piezoelectric elements of Examples 1 to 4 all had shapes with broad widths to show satisfactory piezoelectric properties. It was confirmed from FIG. 12 that the piezoelectric element of Reference Example 1 showed a hysteresis loop having a shape with a width slightly smaller than those of the hysteresis loops in Examples 1 to 4 but had a satisfactory piezoelectric property.

FIG. 13 shows XRD patterns of the piezoelectric elements of Examples 1 to 5 and Reference Examples 1 to 3. It was confirmed from FIG. 13 that the piezoelectric elements of Examples 1 to 5 and Reference Examples 1 to 3 all showed sharp peaks due to the perovskite structures of PT-BLZT near diffraction angles of 22°, 32°, 39°, 46°, and 57°. This means that the PT-BLZT of the piezoelectric elements of these examples have satisfactory crystallinity. It was also revealed that in the PT-BLZT of the piezoelectric element of Example 4, the peaks due to perovskite structures had slightly broader widths to show slightly inferior crystallinity.

It was revealed from the above-described Examples and Reference Examples that piezoelectric materials having satisfactory piezoelectric properties can be obtained by ordinary-pressure synthesis by a thin-film forming process using a solid solution of $PbTiO_3$ (PT) and $Bi(Zn_{0.5}, Ti_{0.5})O_3$ (BZT), without performing high-pressure synthesis, which had been an obstacle specific to $Bi(Zn_{0.5}, Ti_{0.5})O_3$ (BZT). In addition, it was revealed that high-voltage application is possible by partially substituting the Bi site with La to reduce the thickness.

Furthermore, it was revealed that the bismuth-based mixed oxide according to an aspect of the invention can form a piezoelectric body having a satisfactory piezoelectric property, even if it does not contain alkali metal elements being volatile and iron being a transition metal and thereby easily changing its valence to cause leakage.

It was revealed that though the lead content (from 53 to 61% by mass) of the bismuth-based mixed oxide according to an aspect of the invention is low compared to that (lead content: about 76% by mass) of PZT, a very excellent piezoelectric property can be provided. That is, it was revealed that the bismuth-based mixed oxide according to an aspect of the invention is low in environmental load and shows an excellent piezoelectric property.

The above-described embodiment and modified embodiments can be arbitrarily combined, and an embodiment as a combination of a plurality of embodiments can achieve the effects of the respective embodiments or a synergistic effect.

The invention is not limited to the above-described embodiments, and it is possible to further make various modifications. For example, the invention includes constitutions substantially the same as those described in the embodiments (for example, a constitution that is the same in its function, method, and result, or a constitution that is the same in its purpose and effect). Furthermore, the invention includes constitutions in which unessential portions of the constitutions described in the embodiments are substituted. The invention includes constitutions that can achieve the same effect or the same purpose as those of the constitutions described in the embodiments. Furthermore, the invention includes constitutions in which known technology is added to the constitutions described in the embodiments.

What is claimed is:

1. A piezoelectric element comprising:
a piezoelectric layer and an electrode for applying a voltage to the piezoelectric layer, wherein:
the piezoelectric layer includes a solid solution of bismuth lanthanum titanate zincate and lead titanate,
the molar ratio of the bismuth lanthanum titanate zincate to the lead titanate in the piezoelectric layer is 0.39 or more and 0.61 or less,
the piezoelectric layer satisfies the following equation: $(1-u)Pb_{(1+v)}TiO_3-u(Bi_{(1-w)}La_w)(Zn_{(1-x)}Ti_x)O_3$, and
v is greater than 0 and less than or equal to 0.1,
wherein the piezoelectric layer has a thickness of 100 nm or more and 3 μm or less.

2. The piezoelectric element according to claim 1, wherein the molar ratio of bismuth to lanthanum of the bismuth lanthanum titanate zincate is 1.00 or more and 2.33 or less.

3. The piezoelectric element according to claim 1, wherein $0.28<=u<=0.38$, $0.48<=x<=0.5$, and $0.3<=w<=0.5$.

4. The piezoelectric element according to claim 1, wherein the electric field intensity at which electrical breakdown of the piezoelectric layer occurs by applying voltage is 500 kV/cm or more and 2000 kV/cm or less.

5. A liquid ejecting head comprising the piezoelectric element according to claim 1.

6. A liquid ejecting apparatus comprising the liquid ejecting head according to claim 5.

7. The piezoelectric element according to claim 1, wherein the piezoelectric layer is oriented along the (100) plane.

* * * * *